United States Patent [19]

Cooper

[11] Patent Number: 5,499,246

[45] Date of Patent: Mar. 12, 1996

[54] DIGITAL RADIO RECEIVER WHICH DETECTS WHEN A PORTION OF A BURST IS STOLEN FOR A CONTROL MESSAGE

[75] Inventor: Andrew Cooper, Wokingham, England

[73] Assignee: Nokia Mobile Phones (U.K.) Limited, United Kingdom

[21] Appl. No.: 952,559

[22] Filed: Sep. 28, 1992

[30] Foreign Application Priority Data

Oct. 4, 1991 [GB] United Kingdom ............... 9121145

[51] Int. Cl.$^6$ ..................................................... H04J 3/16
[52] U.S. Cl. ............................................ 370/95.1; 370/110.1
[58] Field of Search .................................... 370/110.1, 111, 370/79, 81, 83, 95.1, 85.6, 85.7, 95.3, 99, 110.4, 102; 371/2.1, 30, 38.1

[56] References Cited

U.S. PATENT DOCUMENTS

| | | | |
|---|---|---|---|
| 4,757,499 | 7/1988 | Gorshe | 370/110.1 |
| 5,093,830 | 3/1992 | Nunter | 370/110.1 |
| 5,199,031 | 3/1993 | Dahlin | 370/110.1 |
| 5,245,611 | 9/1993 | Ling et al. | 370/100.1 |
| 5,384,782 | 1/1995 | Elms | 371/2.1 |

OTHER PUBLICATIONS

Goodman, David J.; "Evolution of Wireless Information Networks"; vol. 2, No. 1, Fevrier, 1991, Milano; pp. 105–113; search report also enclosed.

GSM specification, ver. 3.5.1, GSM Recommendation 05.03 (Jan. 1991).

Primary Examiner—Wellington Chin
Assistant Examiner—Chau T. Nguyen
Attorney, Agent, or Firm—Perman & Green

[57] ABSTRACT

A method of receiving data transmitted in a burst-mode radio communications such as GSM. Prior to transmission a set of first data elements (bits) relating to a first message which may be associated with a first channel type (e.g. a traffic channel (TCH) in GSM) has selected bits substituted or "stolen" by data elements (bits) relating to a second message which may be associated with a second channel type (e.g. a fast associated channel FACCH in GSM). The data elements relating to the first and second messages are interleaved over the same or a different number of bursts. In a normal GSM traffic burst two single-bit flags are set to '1' to indicate respectively when the even bits or the odd bits of the burst have been stolen for FACCH data. A detector (5) is used to monitor the flags from the same number of bursts over which the FACCH is interleaved. In order to improve the chance of detecting a FACCH in noisy conditions a majority-vote circuit (9) is employed whereby a FACCH decode is initiated if the number of detected flags set to '1' exceeds a threshold value. Specifically, in the case of FACCH, the threshold value may be 5–8, i.e more than half the number of bursts over which the FACCH data is interleaved.

16 Claims, 5 Drawing Sheets

DIGITAL RADIO RECEIVER WHICH DETECTS WHEN A PORTION OF A BURST IS STOLEN FOR A CONTROL MESSAGE

This invention relates to a method and apparatus for receiving data transmitted in a burst-mode radio communications system.

BACKGROUND OF THE INVENTION

In the present specification digitised signals are referred to as data.

In the pan-European digital cellular radio system known as Groupe Spéciale Mobile (GSM) each of the RF channels is divided into timeslots of approximately 0.577 ms duration. The modulating bit rate for a GSM carrier is 270.838 kbit/s which means that the timeslot corresponds to 156.25 bit durations. During this time period the RF carrier is modulated by a data stream, the extent of which is termed a "burst". In other words, a burst represents the physical content of a timeslot. The timeslots are grouped together in sets of eight consecutive timeslots as one TDMA frame. (TDMA is an acronym for time division multiple access). A physical channel is defined by specifying both a RF channel (or, in the case of frequency hopping, a sequence of RF channels) and a TDMA frame timeslot number. Hence for a given RF channel the system has available to it eight physical channels.

There are two main types of logical channel within the GSM system known respectively as traffic channels (TCHs) and control channels (CCHs). The traffic channels are intended primarily to carry encoded speech or user data, whereas the control channels carry signalling and synchronization data between the base station and the mobile station.

One of the control channels, namely the so-called Fast Associated Control Channel (FACCH), is transmitted using capacity from a traffic channel. In this case, a number of bits from each burst of traffic data are "stolen" for use by the FACCH. In a normal traffic burst B there are two single bit flags which indicate respectively whether all the even bits or all the odd bits of the burst B have been stolen for a FACCH block. Particularly in noisy conditions where one or more of the received steal flags has been 'reversed' there is a risk of failing to detect the FACCH and, consequently, omitting to extract the FACCH data which can result in degraded performance of the receiver.

It is also a feature of the GSM system that the encoded speech and user data is re-ordered and interleaved over a number of TDMA frames. In fact both speech and FACCH data are interleaved in the same way over 8 TDMA frames. Thus when a FACCH decode instruction does occur the FACCH data is extracted from the odd bits of the four most recently received bursts and the even bits of the immediately preceding four bursts. Because of the alignment between the FACCH and speech data interleaving (i.e. both are eight deep) the whole of a speech block is essentially lost to FACCH data when FACCH steal occurs. However, user data channels may be interleaved over twenty-two bursts. A block of 456 bits is split into 4 sets of 114 bits. Each of these sets is interleaved nineteen-deep, but the start of each is offset from the previous one by one burst, making the span over which the whole block is interleaved to be twenty-two bursts. By contrast with the situation in the case of speech data, the longer interleave length means that FACCH does not overwrite a whole block of user data, but instead partially overwrites a series of bursts from a sequence of user data blocks. By contrast with speech data, therefore, the whole of the user data block is not lost when FACCH steal occurs, but on the contrary the user data may be recovered using error correcting techniques as discussed below.

The GSM system uses a forward error correction code. Forward error correction codes are codes which permit correction of errors by the receive station without the need for retransmission. The basic requirement of a forward error correction code is that sufficient redundancy is included in the transmitted data for error correction to be accomplished at the receiver without further input from the transmitter. In the GSM system data is convolutionally encoded before it is transmitted. A maximum likelihood detector such as a Viterbi detector is generally used to decode the received convolutionally encoded data. This decoding process relies on the fact that the information content of each data symbol being decoded is distributed over a plurality of data elements (bits). The receiver includes means for estimating the certainty (or confidence level) of the value of each bit received. These confidence measures can be used to determine the most likely sequence of symbols transmitted, and hence the decoding process is robust to a proportion of erroneous received bits. (It is noted here that there is no coding or redundancy associated with the single bit steal flags).

SUMMARY OF THE INVENTION

According to a first aspect of the present invention there is provided a receiver for receiving data transmitted in a burst-mode radio communications system, wherein data elements relating to a first message are interleaved over a plurality of bursts, and selected data elements relating to said first message are intermittently substituted by data elements relating to a second message and interleaved over a plurality of bursts, each burst including flag means which can be set to indicate if data elements relating to the first message have been substituted by data elements of the second message, the receiver comprising means for extracting and re-ordering the data elements of the received data to reconstitute the first message, means for detecting the flag means over a predetermined number of bursts, and means for extracting the substitute data elements to reconstitute the second message conditional on the proportion of set flag means detected.

A receiver in accordance with the invention is thus able to detect when a second message is present in the received data and responds accordingly by automatically extracting the data elements relating to said second message, when required.

The flag means may be a single bit, e.g. with a '1' indicating that selected data elements (bits) of the associated burst have been stolen by data elements relating to the second message, while a '0' indicates that selected data elements (bits) of the burst relate to the first message (i.e. the original data elements have not been stolen).

Preferably the number of bursts over which the flag means are detected is equal to, and aligned with, the number of bursts over which the data elements relating to the second message are interleaved. Hence in the case of FACCH data interleaved over eight bursts the flag means are detected over eight bursts to determine if FACCH data is present, that is to say, if FACCH steal has occurred.

In a preferred embodiment the means for extracting the substitute data elements are adapted to initiate extraction when the number of set flag means detected is equal to or greater than a threshold value. For example the threshold value may be greater than half the predetermined number of burst over which the flag means are detected. Hence in the case of 8-deep FACCH data the threshold value is at least 5. Therefore FACCH data extraction (decoding) may be initiated if five or more flag means are detected over eight bursts. In this case the threshold may be varied between 5 and 8. However, the lower the threshold the greater the chance of detecting a FACCH in noisy conditions.

Suitably a receiver in accordance with the invention includes means for storing the detected flag means for each of the predetermined number of burst over which the flag means are detected. By way of example the means for storing may include a random access memory (RAM), or one or more shift registers. In a preferred embodiment two shift registers are employed and different sorts of flag means are stored respectively in the two registers. The first sort of flag means, when set, indicate that a first sub-set of data elements relating to the first message have been substituted by data elements relating to the second message. The second sort of flag means, when set indicate that a second set of data elements relating to the first message have been substituted by data elements relating to the second message. The first set of data elements may comprise the data elements relating to the first message disposed at alternate (e.g. odd) locations, and the second set of data elements comprise the data elements disposed at the intervening (even) locations.

In a particular embodiment one of the shift registers is adapted to store more flag means than the other shift register. Specifically one of the shift registers stores twice as many flag means as the other shift register.

According to a further aspect of the present invention there is provided a method of receiving data transmitted in a burst-mode radio communications system, wherein the data elements relating to a first message are interleaved over a plurality of bursts, and selected data elements relating to said first message are intermittently substituted by data elements relating to a second message and interleaved over a plurality of bursts, each burst including flag means which can be set to indicate if data elements relating to the first message have been substituted by data elements of the second message, which method includes the steps of extracting and re-ordering the data elements of the received data to reconstitute the first message, detecting the flag means over a predetermined number of bursts, and extracting the substitute data elements to reconstitute the second message conditional on the proportion of set flag means detected.

It is noted here that the first and second messages may be associated respectively with first and second channel types specifically, for example in GSM, traffic channels (TCHs) and fast associated control channels (FACCHs). As used herein the term 'message' means a set of data elements (e.g. bits) irrespective of the length or information content thereof.

BRIEF DESCRIPTION OF THE DRAWINGS

An embodiment of the invention will now be described, by way of example, with reference to the accompanying drawings in which.

DETAILED DESCRIPTION OF THE INVENTION

The present receiver is intended for receiving interleaved convolutionally encoded data transmitted in a burst-mode radio communication such as GSM. The function of the parts of the receive processing which will now be described is to accept physical channels from an equaliser, to de-interleave, and then to perform a convolutional decode.

Figure 1:
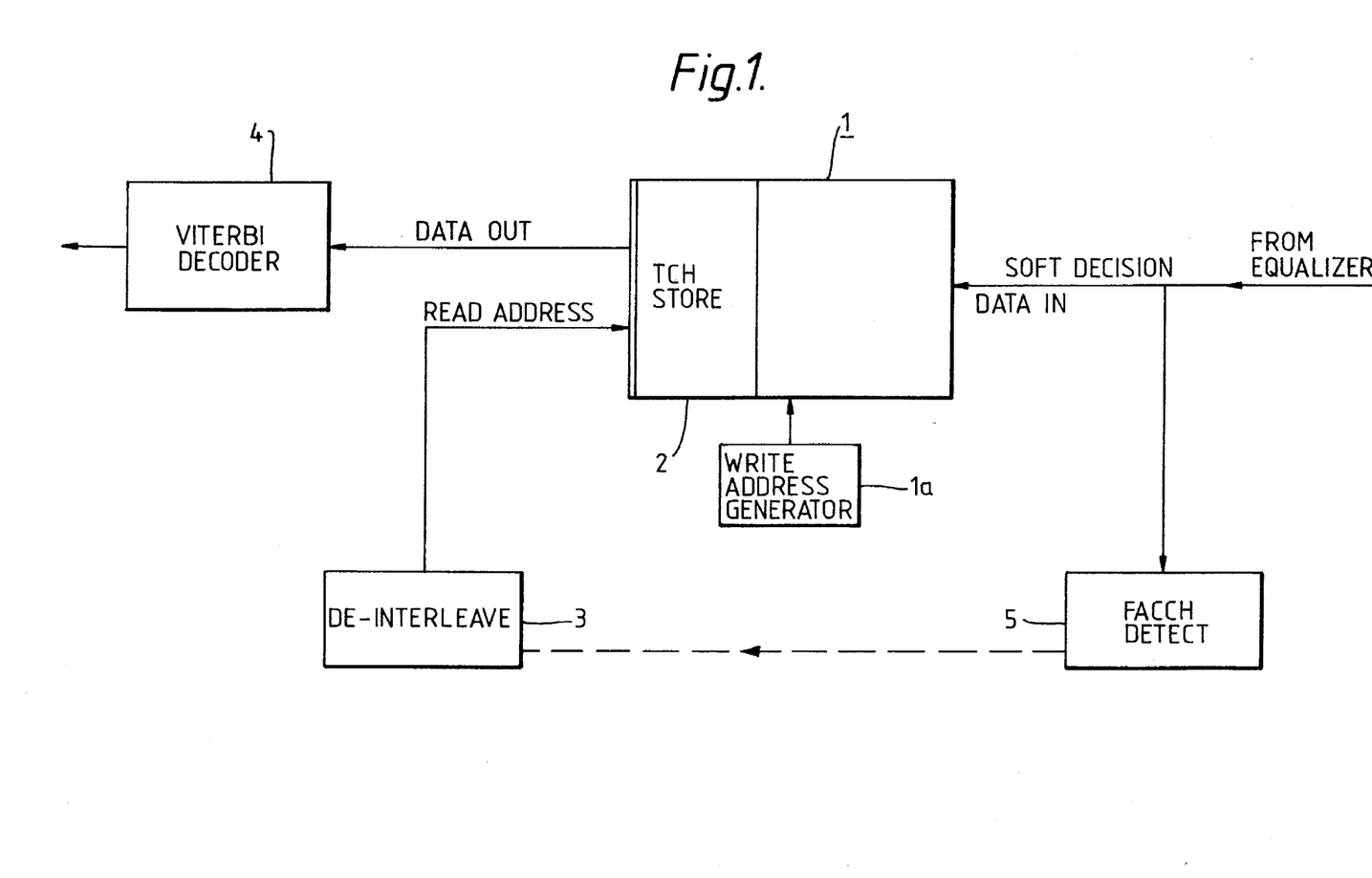
FIG. 1 is a schematic datapath block diagram of the de-interleaving and decoding stages of a receiver including a FACCH detector in accordance with the present invention.

Referring to FIG. 1, bursts of data from the equaliser are input to a de-interleave store 1 comprising a random access memory (RAM). The de-interleave RAM 1 comprises a segment 2 for storing data from traffic channels (TCHs) and may also comprise further segments (not shown) for storing respectively data from synchronization channels (SCHs) and control channels (CCHs) other than FACCH.

The input from the equaliser to the de-interleave process is a set of bursts, each containing 114 bits. More strictly, each burst contains 114 'soft decisions' i.e. a weighted value indicative of the confidence level that the received data symbol is correctly represented. In other words the estimated data symbols may be quantized at more levels than there are symbols in the set of data symbols comprising the so-called alphabet. The number of quantization levels is a matter of design choice depending on the precision required.

Figure 2:
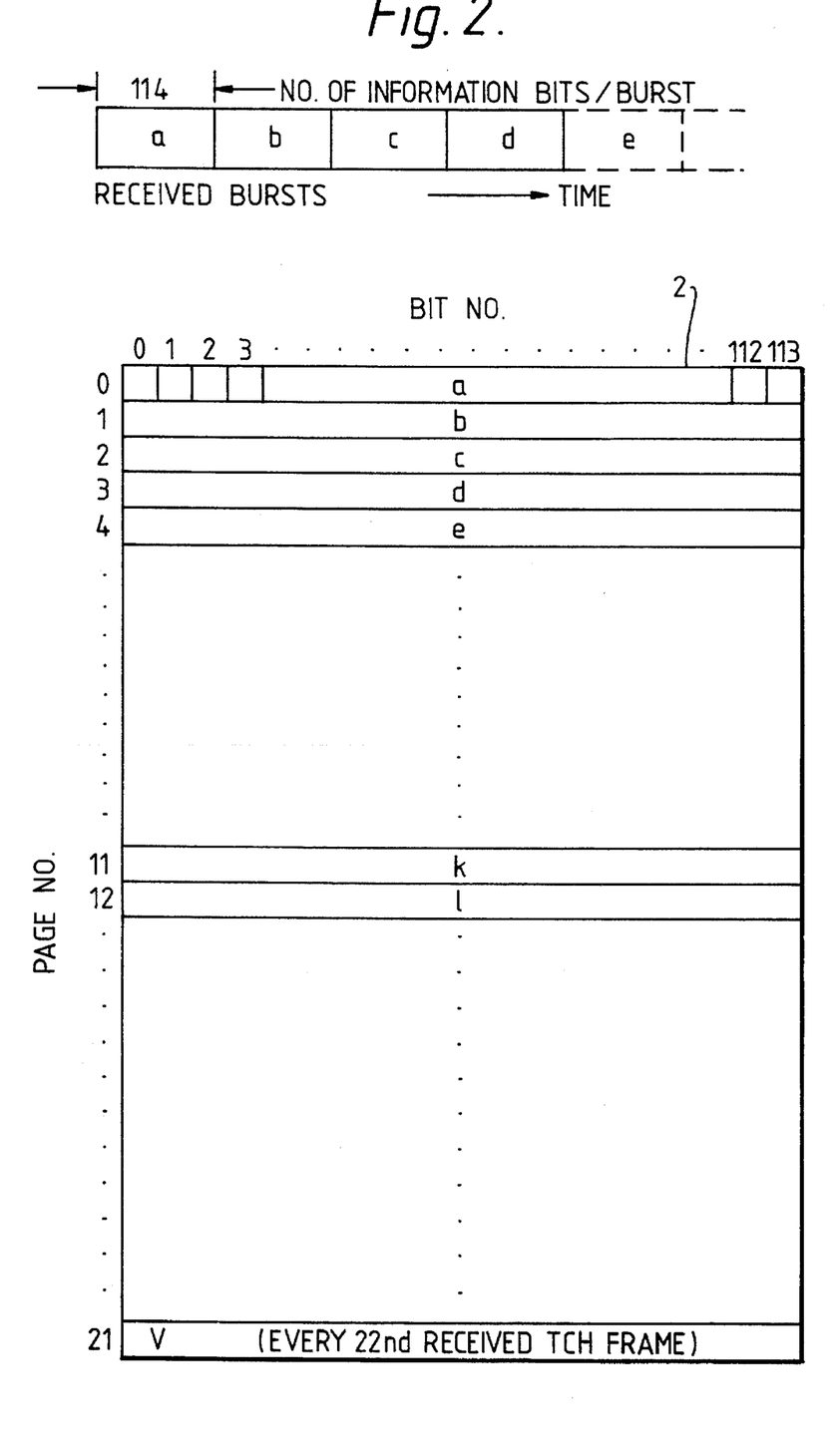
FIG. 2 is a schematic diagram showing in more detail the organization of the RAM (random access memory) in the de-interleaving stage of the receiver in FIG. 1.

The part of the data stream from the equaliser relating to TCH traffic bursts is stored in the TCH store 2 with the aid of write address generator 1a as will now be described with reference to FIG. 2. The RAM used for the TCH store is suitably arranged in 128-word pages of which only 114 will be used for storing TCH data. The data input from the equaliser is essentially stacked sequentially into the TCH store 2. Thus the 114 soft decisions of a first burst a are stored at page 0 in the same order in which they are received. Hence the soft decision stored at position labelled "Bit No. 0" in FIG. 2 will be the first bit (soft decision) of burst a. The soft decision stored at position labelled "Bit No. 1" in FIG. 2 will be the second bit of burst a, and so on until the soft decision stored at position labelled "Bit No. 113" in FIG. 2 will be the last bit of burst a. When all the bits of the first burst a are stored in the first page of the TCCH store 2, subsequent burst b,c,d are stored sequentially in the immediately following pages of the memory. It is noted here that the word length is determined by the particular precision of the soft decisions used. For example the word length will be 8 bits if 8 bit soft decisions are being used.

In the case of user data channels interleaved over 22 bursts a full 22 bursts have to be read into the TCH store before a first meaningful traffic decode can occur. After the first meaningful traffic decode the next four bursts are read into burst positions (page Nos.) 0,1,2 and 3 of the TCH store 2. The data previously held in these positions will have served its useful purpose during the previous TCH decode. After storing those next four bursts the next TCH decode occurs. The receive process continues by putting four bursts sequentially into contiguous positions "freed" at the previous decode stage. In the steady state, therefore, TCH decodes occur every four frames. It is noted here that in the case of speech data channels interleaved over eight bursts, TCH decodes also occur every four frames in the steady state. Initially eight bursts have to be read into the TCH store before a first meaningful decode can occur.

The TCH decodes referred to above are implemented by means of a de-interleave process functionally represented at block 3 in FIG. 1, which can be regarded as an address generator driven by a predetermined de-interleave algorithm. The de-interleave process outputs blocks of data corresponding to the originally transmitted blocks. The de-interleaving process can be regarded as a mapping of data bits. The input to the process is a set of bursts, each containing 114 bits. The output of the process is a set of TCH data blocks each comprising 456 bits. Hence the order in which the stored bits are read out of the TCH store is determined by the de-interleave algorithm.

The output data blocks are then input to a Viterbi decoder 4 which decodes the convolutionally encoded data output from the de-interleaving process. If any errors are present the Viterbi decoder attempts to correct them using a maximum likelihood sequence estimation algorithm. Our co-pending British patent application No. 9015854.4 (our ref PAT 90012), the contents of which are hereby incorporated by reference, describes a Viterbi decoder in more detail.

As mentioned previously the Fast Associated Control Channels (FACCH), which carry signalling data (e.g. for sending handover messages), obtain access to the physical resource by 'stealing' from the traffic channel with which it has been assigned. For a normal traffic burst there are two single bit flags which indicate whether the traffic data has been stolen for a FACCH block—see FIG. 4. These two flags indicate respectively whether all the even bits or all the odd bits of that burst have been stolen. The even-steal bit is set to '1' if all the even bits of the burst are used for FACCH signalling. Similarly, the odd-steal bit is set to '1' if all the odd bits of the burst are used for FACCH signalling. If the even-steal bit and the odd-steal bit are '0's then all the bits within the burst belong to the traffic channel.

Figure 4:
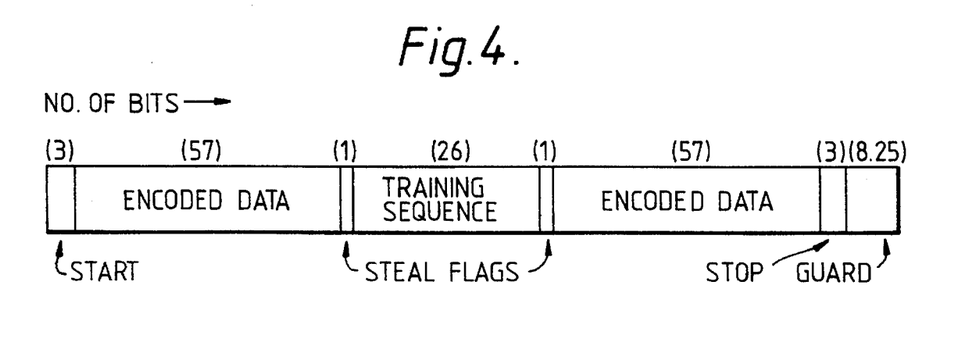
FIG. 4 is a diagram illustrating the component data elements of a burst.

As shown in FIG. 4, the normal GSM burst comprises 8.25 bits guard period, 114 encoded data bits divided into two equal blocks of 57 bits (conveying the traffic data in encoded form). The remaining bits are used as start and stop tail bits (3 bits each) at the extreme ends of the encoded data and a 26 bit training sequence located between the two blocks of encoded data bits used in the equalisation process. The two single bit steal flags occur on either side of the training sequence.

A FACCH detector 5 monitors the steal flags in the bursts received from the equaliser. If a FACCH is detected a FACCH decode will be initiated as described in more detail below.

As noted above the FACCH channels are interleaved over 8 bursts. This means that a FACCH decode can occur after 8 bursts have been read into the TCH store 2. The position of the eight bursts containing FACCH data within the RAM 2 is variable depending on when FACCH steal actually occurs. The function of the de-interleaver 3 during the FACCH decode is to restore the original FACCH data blocks by generating the appropriate addresses in the correct sequence so that the data read out of the TCH store 2 corresponds to the FACCH data blocks, and taking into account the relative interleave depths, for example in the case of data channels the FACCH decode is required from 22-deep interleaved TCH data sometimes referred to as TCH (22). In the case of speech channels on the other hand, the FACCH decode is required from 8-deep interleaved TCH data sometimes referred to as TCH (8).

The FACCH detector 5 will now be described in more detail with reference to FIG. 5.

The two steal bit flags from each burst output by the equaliser are input to the detector 5. A de-multiplexer 6 directs alternate steal bit flags to an 8-bit shift register 7 and a 4-bit shift register 8. Hence the even-steal bits are stored in register 7 while the odd steal bits are stored in register 8. The whole contents of the shift register 8 and the bits stored in the four least significant bit positions (i.e. the four right hand bits) in the shift register 7 are input to a majority-vote circuit 9. The inputs to circuit 9 thus represent the odd-steal bits of the four most recently received bursts and the even-steal bits of the previously received four bursts. If the number of '1's input to the majority-vote circuit exceeds a predetermined quantity then an instruction is generated to commence a FACCH decode. Specifically the threshold value of the majority-vote circuit 9 may be set at between 5 and 8 inclusive, it being noted that the lower the threshold the greater is the chance of detecting a FACCH in noisy conditions. Any suitable logic circuit may be used for the majority-vote circuit 9.

Figure 5:
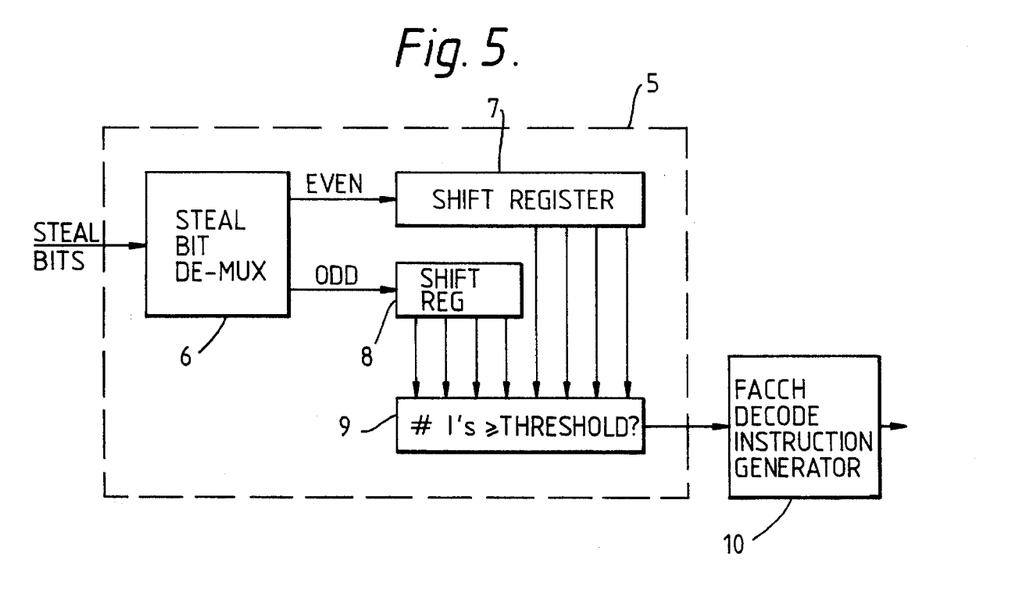
FIG. 5 is a block diagram showing in more detail the FACCH flag detector of the receiver in FIG. 1.
Figure 6:
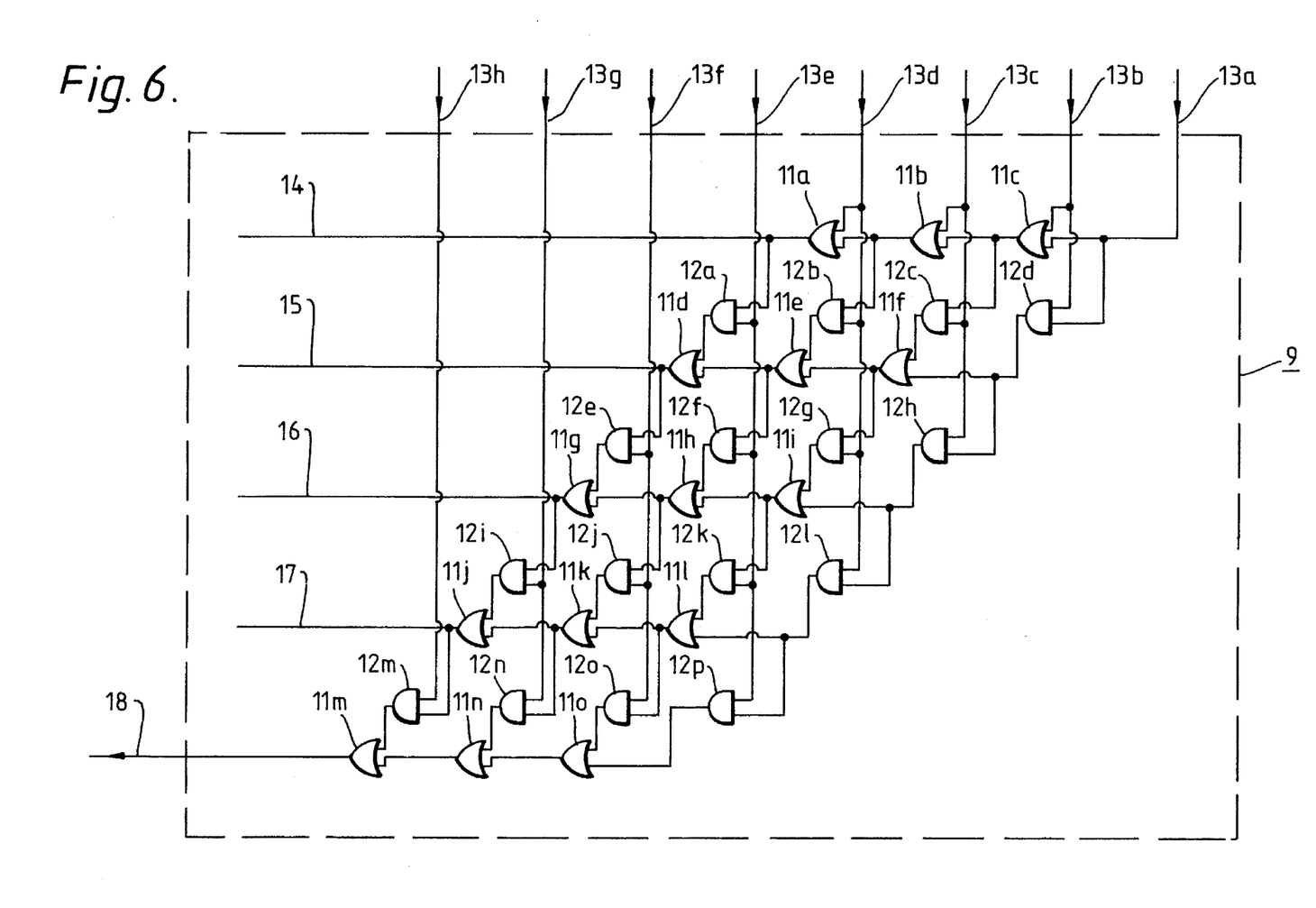
FIG. 6 is a logic circuit diagram of the FACCH detector in FIG. 5.

FIG. 6 is a circuit diagram illustrating suitable logic for implementing a gate-efficient five-out-of-eight majority vote circuit 9, including fifteen OR gates 11a–11o and sixteen AND gates 12a–12p connected to the eight parallel inputs 13a–13h from the shift registers 7 and 8 (see FIG. 5). The output of OR gate 11a (line 14) will be '0' if all four inputs 13a–13d are '0', but the output of OR gate 11a (line 14) will be '1' if one or more of the four inputs 13a–13d is '1'. The output of OR gate 11d (line 15) will be '1' if two or more of the five inputs 13a–13e are '1's. Otherwise the output of OR gate 11d (line 15) will be 0. Similarly, the output of OR gate 11g (line 16) will be '1' if three or more of the six inputs 13a–13f are '1's. Otherwise the output of OR gate 11g (line 16) will be '0'. Likewise, the output of OR gate 11j will be '1' if four or more of the seven inputs 13a–13g are '1's. Otherwise the output of OR gate 11j (line 17) will be '0'. Finally, the output of OR gate 11m, and hence the overall output 18 of the majority vote circuit 9 will be '1' if five or more of all eight inputs 13a–13h are '1's. Otherwise the output 18 will be '0'.

The output of majority-vote circuit 9 is thus a single bit, i e a '1' or '0' indicative respectively of whether or not a FACCH has been detected. The output of circuit 9 is input to a FACCH decode instruction generator 10 which will generate a FACCH decode instruction on each occasion when both (a) the burst count is appropriate for a FACCH decode to commence (since a FACCH decode can only start at predetermined burst positions relative to a TCH decode, as discussed in more detail below), AND (b) the input from the majority-vote circuit 9 indicates that a FACCH has been detected. When a FACCH decode instruction occurs the FACCH data is extracted from the odd bits of the four most recently received bursts and the even bits of the immediately preceding four burst by the de-interleaver 3 as discussed above.

In accordance with the method disclosed and claimed in our co-pending British Patent Application No. (our ref: PAT 91016) the FACCH de-interleave process may be modified so that a soft-decision '0' is written into the TCH store memory locations previously occupied by the constituent bits of the FACCH block. A zero-valued soft decision indicates that there is no confidence (i.e. maximum uncertainty) as to whether the received data symbol (bit) was a '1' or a '0'. The returning of soft decision zeros at the FACCH decode stage may be implemented in two ways, as follows. In the first case, each time a bit is read out of the TCH store 2 during FACCH decode the read address generated by the de-interleaver is used to write-back a zero-valued soft decision to the same location. Alternatively, because in practice data will be read out of the TCH store 2 very rapidly, rather than perform alternate read/write-back, it may be preferable to run the de-interleave address generation circuitry twice, reading out the stored values on the first phase and writing in the zeros on the second phase.

Figure 3:
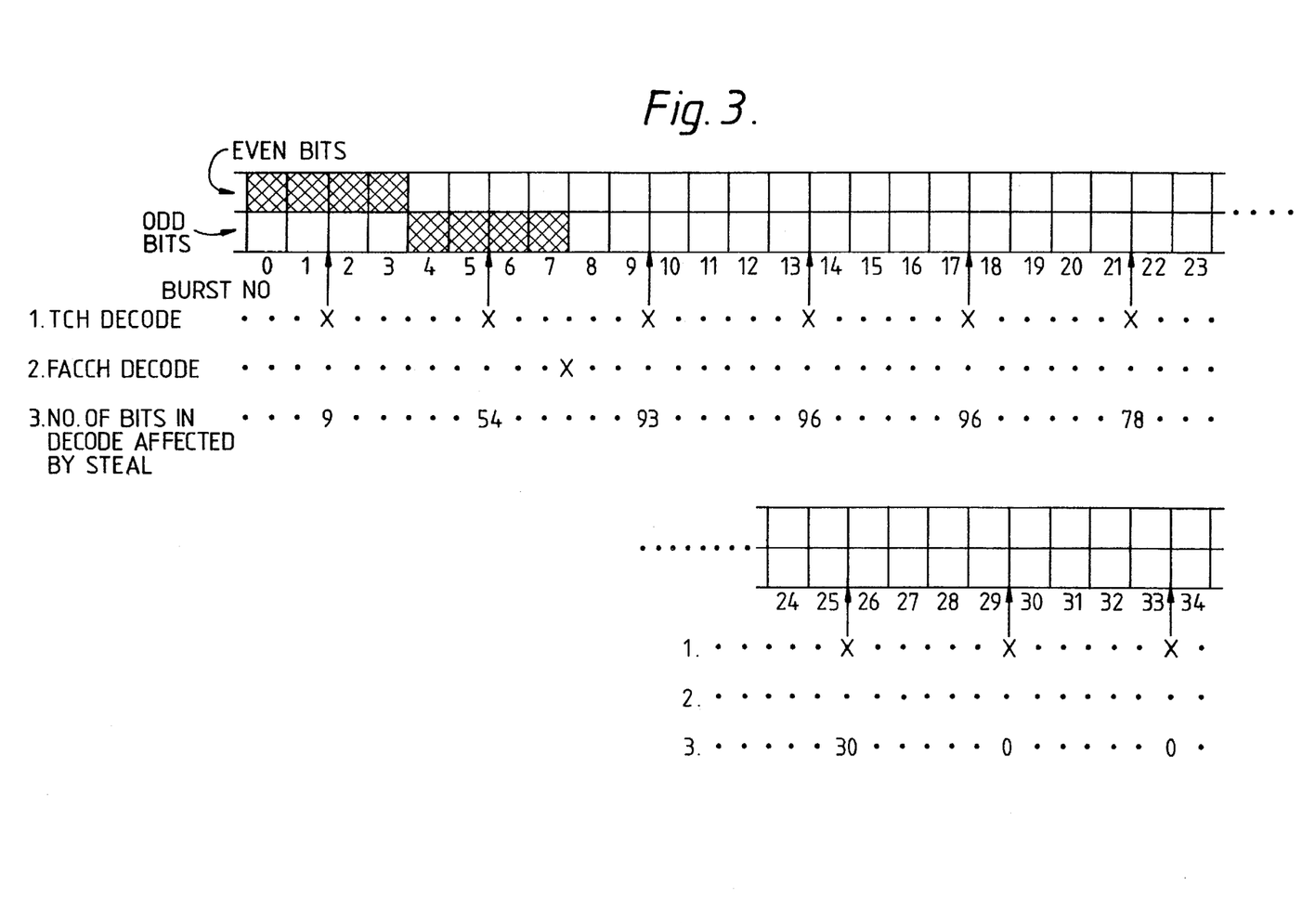
FIG. 3 is a diagram illustrating the effect of FACCH steal on a differently interleaved TCH.

In GSM it is arranged that, for data channels, FACCH decodes are offset by two bursts from TCH (22) decodes (whereas FACCH and TCH (8) decodes are aligned). A FACCH contributes a varying number of bits to subsequent TCH (22) decodes due to the staggering of decode points, and the different interleave structures. After a FACCH starts, it can be shown that it contributes {9,54,93,96,96,78,30} bits respectively to subsequent TCH (22) decodes, as shown in FIG. 3.

After FACCH steal has begun the FACCH decode occurs between the second and third TCH (22) decodes (because it is necessary to look back at the steal flags over the previous eight bursts to have sufficient information to know that a FACCH decode is required). Therefore the substitution for FACCH data with zero-value soft decisions can be effected only for the third and subsequent TCH (22) decodes, as can be seen from FIG. 3. The result of this is that 63 out of 456 FACCH bits cannot be erased. Hence the scheme is 86% effective.

The advantage of replacing the FACCH data with a zero-valued soft decision after the FACCH decode has occurred is that the zero-valued soft decision will then be incorporated into the TCH data block at the subsequent convolutional decode stage. The zero-valued soft decision indicates that there is no confidence that the transmitted bit (i.e. the original TCH bit which was stolen) was a '1' or a '0'. The Viterbi decoder 4 will therefore have an improved chance of correcting the "error" caused by the steal and hence has a better chance of recovering therefrom. Accordingly the FACCH data will not be subject to an attempted decode as traffic data. It will be appreciated that the FACCH data would essentially represent an erroneous confidence level as regards a transmitted TCH bit, and if decoded as traffic data will inevitably degrade the bit error rate performance of the Viterbi decoder.

It is noted here that the only time when the data bits can simply be determined as stolen by a FACCH is when the FACCH decode actually occurs. By the time the next traffic decode occurs, because of the complex interrelationship between the different interleaving schemes, it will not be straightforward to determine which data bits were stolen. This is why the present method replaces the FACCH data bits with zero-valued soft-decisions as part of the FACCH decode process. It will be understood that this 'erasure' of FACCH data bits is advantageous when the FACCH data and the TCH data are differently interleaved as in the case of user data since it is still possible to recover TCH data when FACCH steal occurs, but it will have no useful effect when the whole of the TCH data block is lost due to FACCH steal as in the case of speech data.

In view of the foregoing description it will be evident to a person skilled in the art that various modifications may be made within the scope of the present invention. For example rather than using shift registers other memory means such as a random access memory (RAM) may be employed for storing the steal flags. Moreover, it will be appreciated that the present invention can also be used when the FACCH and TCH are interleaved over the same depth as in the case of speech data. In this case it should be noted that FACCH decodes are not offset from the TCH decodes but are coincident therewith. However, the invention is not restricted to GSM and FACCH steal, but may have application in any burst-mode radio communications system wherein the data elements relating to a first message are interleaved over a number of bursts, and selected data elements relating to the first message are from time to time replaced by data elements relating to a second message and interleaved over the same or a different number of bursts. The number of bursts over which the steal flag bits are detected will generally be equal to the number of bursts over which the data elements of the second message are interleaved (and aligned therewith) in order to be able to determine with confidence that a second message is present in the received data and needs to be extracted and, if appropriate, decoded.

I claim:

1. A receiver for receiving data transmitted in a burst-mode radio communications system, wherein first data elements relating to a first message are interleaved over a first plurality of bursts, and selected data elements relating to said first message are substituted by second data elements relating to a second message and interleaved over a second plurality of bursts, each burst including flag means which can be set to indicate if data elements relating to the first message have been substituted by data elements of the second message, the receiver comprising:

first means for extracting and re-ordering data elements of received data over said first plurality of bursts to reconstitute the first message, second means for detecting the flag means over a predetermined number of said bursts, and third means coupled to said second means for extracting substitute second data elements to reconstitute the second message conditional on a proportion of set flag means being detected by said second means.

2. A receiver as claimed in claim 1, wherein a window over which the flag means are detected is temporally aligned with the second plurality of bursts over which the second data elements relating to the second message are interleaved.

3. A receiver as claimed in claim 1, wherein said second data elements are interleaved over a determined number of bursts and the flag means are detected over a second determined number of bursts and wherein the number of bursts over which the flag means are detected is equal to the number of bursts over which the second data elements relating to the second message are interleaved.

4. A receiver as claimed in claim 1, wherein a number of set flag means are detected by said second means and the third means for extracting the second data elements initiates said extracting when the number of set flag means detected is equal to or exceeds a threshold value.

5. A receiver as claimed in claim 4, wherein the threshold value is greater than half the predetermined number of bursts over which the flag means are detected.

6. A receiver as claimed in claim 1, including means for storing the detected flag means for each of the predetermined number of bursts over which the flag means are detected by said second means.

7. A receiver as claimed in claim 6, wherein the means for storing the detected flag means comprise at least one shift register.

8. A receiver as claimed in claim 7, wherein the means for storing the detected flag means comprise two shift registers for storing respectively two different sorts of flag means, wherein a first sort of flag means, when set, indicates that a set of said first data elements relating to the first message have been substituted by a set of said second data elements relating to the second message, and the second sort of flag means, when set, indicates that another set of said first data elements relating to the first message have been substituted by a set of second data elements relating to the second message.

9. A receiver as claimed in claim 8, wherein the set of first data elements comprise the data elements relating to the first message disposed at alternate locations, and the set of second data elements comprise the data elements disposed at the intervening alternate locations.

10. A receiver as claimed in claim 8, wherein one of said shift registers is adapted to store more flag means than the other shift register.

11. A receiver as claimed in claim 10, wherein said one shift register is adapted to store said first sort of flag means for the 2N most recently received bursts, and the other shift register is adapted to store the second sort of flag means for the N most recently received bursts, where N is a positive integer.

12. A method of receiving data transmitted in a burst-mode radio communications system, wherein first data elements relating to a first message are interleaved over a first plurality of bursts, and selected first data elements relating to said first message are substituted by second data elements relating to a second message and interleaved over a second plurality of bursts, each burst including flag means which can be set to indicate if first data elements relating to the first message have been substituted by second data elements of the second message, which method includes the steps of:

extracting and re-ordering data elements of the received data over said first plurality of bursts to reconstitute the first message, detecting the flag means over a predetermined number of said bursts, and extracting substitute second data elements to reconstitute the second message conditional on a proportion of set flag means being detected.

13. A method of receiving data as claimed in claim 12, wherein a window over which the flag means is detected is temporally aligned with the second plurality of bursts over which the second data elements relating to the second message are interleaved.

14. A method of receiving data as claimed in claim 12, wherein said second data elements are interleaved over a first determined number of bursts and the flag means are detected over a second determined number of bursts and wherein the number of bursts over which the flag means are detected is equal to the number of bursts over which the second data elements relating to the second message are interleaved.

15. A receiver as recited in claim 1 wherein said first plurality of bursts and second plurality of bursts are the same bursts.

16. The method as recited in claim 12 wherein said first plurality of bursts and said second plurality of bursts are the same bursts.

\* \* \* \* \*